(12) United States Patent
Wise

(10) Patent No.: US 10,240,450 B2
(45) Date of Patent: Mar. 26, 2019

(54) DEPTH RANGE MANAGER FOR DRILL STRING ANALYSIS

(71) Applicant: LANDMARK GRAPHICS CORPORATION, Houston, TX (US)

(72) Inventor: Matthew E. Wise, Sugar Land, TX (US)

(73) Assignee: Landmark Graphics Corporation, Houston, TX (US)

( * ) Notice: Subject to any disclaimer, the term of this patent is extended or adjusted under 35 U.S.C. 154(b) by 157 days.

(21) Appl. No.: 15/109,441

(22) PCT Filed: Jan. 30, 2014

(86) PCT No.: PCT/US2014/013855
§ 371 (c)(1),
(2) Date: Jun. 30, 2016

(87) PCT Pub. No.: WO2015/116101
PCT Pub. Date: Aug. 6, 2015

(65) Prior Publication Data
US 2016/0326856 A1    Nov. 10, 2016

(51) Int. Cl.
*E21B 44/00* (2006.01)
*G06F 17/50* (2006.01)
*E21B 21/00* (2006.01)

(52) U.S. Cl.
CPC .......... *E21B 44/00* (2013.01); *G06F 17/5009* (2013.01); *E21B 2021/006* (2013.01)

(58) Field of Classification Search
CPC . E21B 44/00; E21B 2021/006; G06F 17/5009
(Continued)

(56) References Cited

U.S. PATENT DOCUMENTS 6,612,382 B2 * 9/2003 King .................... E21B 7/00
                                                    175/40
8,561,720 B2   10/2013 Edbury et al.
(Continued)

FOREIGN PATENT DOCUMENTS

WO    2008039523    4/2008
WO    2012121731    9/2012
(Continued)

OTHER PUBLICATIONS

Tim_2011 (Removing points and lines from MATLAB plot, Dec. 20, 2011, downloaded from https://stackoverflow.com/questions/8575071/removing-points-and-lines-from-matlab-plot).*
(Continued)

*Primary Examiner* — Brian S Cook
(74) *Attorney, Agent, or Firm* — Locke Lord LLP

(57) ABSTRACT

A depth range manager provide users with a way to run and retain multiple depth range analyzes for a drill string operation, including the operational parameters for each analysis. This allows users easily to view and compare the analyzes at the different drilling depth ranges. In some embodiments, instead of drilling depth ranges, users may also urn and retain multiple different models and analyzes using multiple different drilling times. The operational parameters for the multiple different models and analyzes may be defined and stored using a flexible one-to-many database structure that accommodates the different sets of operational parameters as well as any existing single-analysis parameters associated with legacy analyzes. A graphical interface allows users easily to define and store the operational parameters in the flexible one-to-many database structure.

20 Claims, 24 Drawing Sheets

(58) Field of Classification Search
USPC .............................................................. 703/7
See application file for complete search history.

(56) References Cited

U.S. PATENT DOCUMENTS

2005/0279532 A1    12/2005  Ballantyne et al.
2014/0214476 A1*   7/2014   Dirksen ........... G06Q 10/06316
                                                      705/7.26

FOREIGN PATENT DOCUMENTS

WO       2012144991       10/2012
WO    WO 2012/144991 A1 * 10/2012   ............. G06F 19/00

OTHER PUBLICATIONS

Guzel_2010 (SQL for Beginners: Part 3—Database Relationships Jan. 13, 2010 downloaded from https://code.tutsplus.com/articles/sql-for-beginners-part-3-database-relationships--net-8561).*
PCT Search Report for PCT Application No. PCT/US14/13855 dated Jan. 30, 2014.
PCT Written Opinion for PCT Application No. PCT/US14/13855 dated Jan. 30, 2014.
Extended European Search Report for EP Application No. 14880578.1 dated Sep. 1, 2017.
Examiner Letter for Canadian Application No. 2,934,610 dated Apr. 28, 2017.
International Preliminary Report on Patentability for PCT International Application No. PCT/US2014/013855 dated May 31, 2016.

* cited by examiner

| Case_Id (PK) | Wellbore_Id (PK) | Well_Id (PK) | Description | Start Depth | End Depth | IsEnabled | DSWETda Params_Id | DSWEHyd Params_Id | DSWEUbd Params_Id | Sequence_No |
|---|---|---|---|---|---|---|---|---|---|---|
| avjdnf | ehyad | omdok | First Row | 0 | 20000 | NULL | null | null | abcde | 0 |

FIG. 11A

| Case_Id (PK) | Wellbore_Id (PK) | Well_Id (PK) | Description | Start Depth | End Depth | IsEnabled | DSWETda Params_Id | DSWEHyd Params_Id | DSWEUbd Params_Id | Sequence_No |
|---|---|---|---|---|---|---|---|---|---|---|
| avjdnf | ehyad | omdok | First Row | 0 | 5000 | TRUE | null | null | abcde | 0 |
| avjdnf | ehyad | omdok | MiddleAnalysis | 5000 | 10000 | FALSE | mplem | irhu9 | pklmd | 1 |
| avjdnf | ehyad | omdok | MiddleAnalysis2 | 7000 | 10000 | TRUE | ldmis3 | padm5 | Mahdq | 2 |
| avjdnf | ehyad | omdok | Last Row | 10000 | 20000 | TRUE | masdi4 | lao9e | mdisd3 | 3 |

FIG. 11B

DEPTH RANGE MANAGER FOR DRILL STRING ANALYSIS

FIELD OF THE INVENTION

The embodiments disclosed herein relate generally to techniques for modeling and analyzing well bore drilling operations for recovery of hydrocarbons in a subterranean formation, and particularly to a computer-implemented method, system, and computer program product for managing multiple instances of such modeling and analysis.

BACKGROUND OF THE INVENTION

A typical drilling operation involves using a drill string to transmit drilling fluid ("mud") and torque down a well bore to a drill bit to break up rocks and other material in the formation. The drill string is a column, or string, of pipes that allows the drilling fluid to be pumped down through the drill string and circulated back up an annulus or gap formed between the drill string and an outer casing, which is a larger pipe within the well bore that is held in place with cement to stabilize the well bore. A typical drill string comprises drill pipes, transition pipes, a drill bit, drill collar, various tools and instruments, and the like. The drill string is held up by a hoisting apparatus on a drilling rig and lowered into and pulled out of the well bore, called "tripping in" and "tripping out," to bore a path through the formation.

Designing complex drill string operations requires rigorous analysis to define key aspects of each pipe-related operation in the wellbore. For example, determining which drill rig or equipment to use, the proper string components, and the appropriate drilling fluid properties and parameters to drill safely and efficiently are but a few of the challenges those having ordinary skill in the drilling art must address. Managing these challenges requires complex solutions that simplify the complexity using the latest scientific tools and technologies to model and analyze the complexity.

A number of solutions exist in the industry for modeling and analyzing drill string operations. One example is the DecisionSpace® Well Engineering Software available from Landmark Graphics Corporation, a division of Halliburton Energy Services, Inc. This software allows operators to select the optimum rig and equipment, string components, and fluids to drill various types of wells (onshore, offshore, deep water, high-pressure/high-temperature, 3-D directional, profiles, horizontal, and extended reach). Among other things, the software models pipe strings to define the optimum windows of operation during the design and execution phases of the well and anticipates risks and generally allows faster drilling without compromising operation safety.

Existing solutions, however, typically operate on a single analysis basis such that only one analysis may be presented at a time. For a given modeling session, once a user initiates an analysis, the results of the previous analysis are discarded and no longer available for that session. The user cannot easily go back to the previous analysis during the current session, but instead must reenter all the operational parameters from the previous analysis and rerun the analysis in order to see the results of the earlier analysis. More importantly, the user cannot easily view and compare the results of the previous analysis with any new analyses, for example, on a side-by-side basis, to see what impact the change in one or more operational parameters may have had on the analyses.

A need therefore exists for improved techniques for modeling and analyzing oil and gas drilling operations, and particularly for managing multiple instances of such modeling and analysis. The disclosed embodiments satisfy one or more of these needs and solve other problems as well.

BRIEF DESCRIPTION OF THE DRAWINGS

The foregoing and other advantages of the disclosed embodiments will become apparent upon reading the following detailed description and upon reference to the drawings, wherein:

FIGS. 11A-11B illustrate exemplary tables that may be used in the exemplary database architecture of FIG. 10 according to the disclosed embodiments.

DETAILED DESCRIPTION OF THE DISCLOSED EMBODIMENTS

As an initial matter, it will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

The disclosed embodiments relate to a computer-implemented method, system, and computer program product for managing multiple models and analyses of a drilling operation. The embodiments provide users with a way to run and retain multiple different models and analyses in a given modeling session, including the operational parameters for each model and analysis, at different drilling depth ranges. This lets users easily view and compare the models and analyses at the different drilling depth ranges. In some embodiments, instead of drilling depth ranges, users may also run and retain multiple different models and analyses using multiple different drilling times. The operational parameters for the multiple different models and analyses may be defined and stored using a flexible one-to-many database structure that accommodates the different sets of operational parameters as well as any existing single-analysis parameters associated with legacy analyses that were stored using a one-to-one database structure. A graphical interface allows users easily to define and store the operational parameters in the flexible one-to-many database structure.

Figure 1:
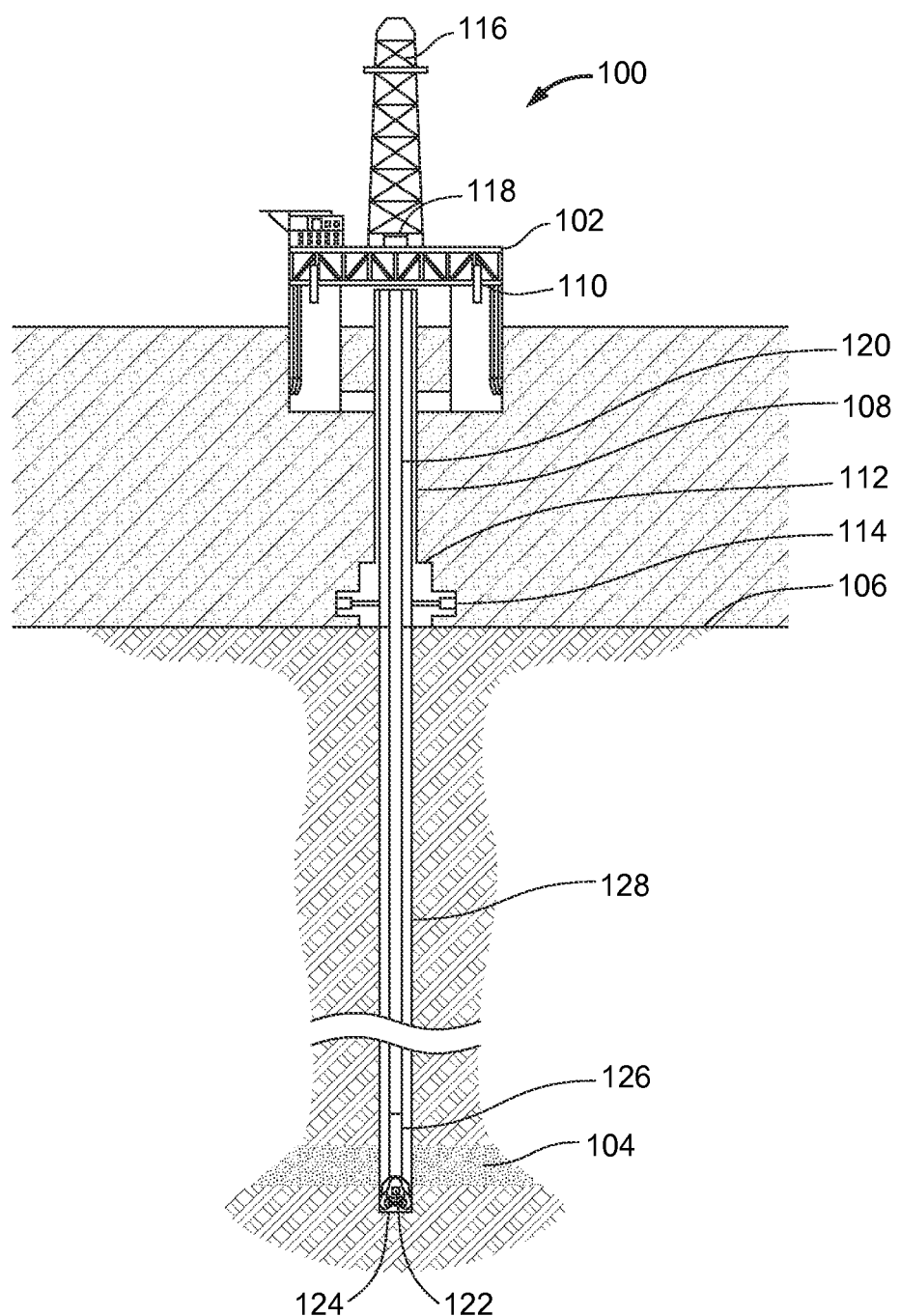
FIG. 1 is a schematic diagram of an offshore oil or gas drilling platform that may be modeled and analyzed according to the disclosed embodiments.

In general, the drilling operations that are modeled and analyzed using the embodiments disclosed herein are performed on either an onshore or an offshore drilling structure, such as the offshore drilling structure 100 illustrated in FIG. 1. Such a drilling structure 100 typically includes a semi-submersible drilling platform 102 centered over a well bore in an oil or gas formation 104 located below a sea floor 106. A subsea conduit 108 extends from a deck 110 of the platform 102 to a well head installation 112 including blowout preventors 114. The platform 102 has a derrick 116 and a hoisting apparatus 118 for raising and lowering a drill string 120, also called tripping. The drill string 120 is attached to a drill bit 122 having tools and sensors 124 mounted thereon for monitoring and measuring various aspects of the drilling operation. The drill bit 122 itself is mounted to the drill string 120 via a drill collar 126. An outer casing 128 cemented in the well bore helps protect the integrity of the well bore and forms an annulus with the drill string 120 for removal of drilling fluid.

As evident from FIG. 1, there are multiple depth ranges in the formation 104 that the drill string 120 may penetrate during the course of a drilling operation. It would be desirable for any method or system for modeling and analyzing the drill string operation to be able to do so at specific, targeted depth ranges within the formation 104. Moreover, it would be desirable for any such method or system to be to able track and retain the models and analyses that are obtained at the targeted depth ranges. An example of a drill string analysis system that can generate and retain multiple different models and analyses based on multiple different depth ranges according to the disclosed embodiments is depicted generally in FIG. 2 at 200. It should be noted that although FIG. 2 and other figures herein focus on depth ranges as a basis for the models and analyses, those having ordinary skill in the art will understand that the principles and teachings disclosed herein are equally applicable to models and analyses that use multiple different time ranges as well.

Figure 2:
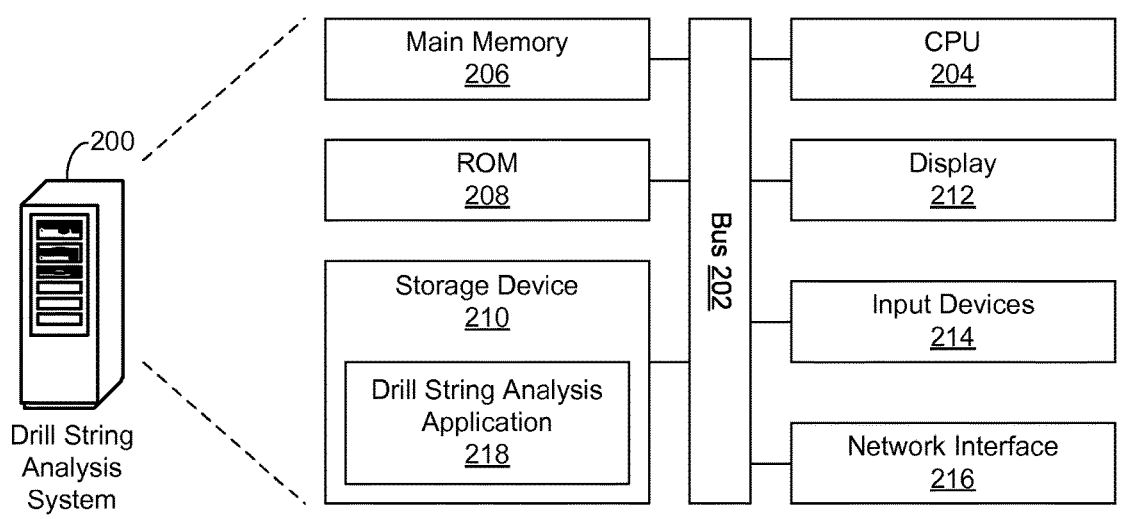
FIG. 2 is an exemplary system that may be used to perform drill string analysis according to the disclosed embodiments.

As seen in FIG. 2, the exemplary drill string analysis system 200 may be a conventional workstation, desktop, or laptop computer, or it may be a custom computing system developed for a particular application. In a typical arrangement, the system 200 includes a bus 202 or other communication pathway for transferring information within the drill string analysis system 200, and a CPU 204 coupled with the bus 202 for processing the information. The drill string analysis system 200 may also include a main memory 206, such as a random access memory (RAM) or other dynamic storage device coupled to the bus 202 for storing computer-readable instructions to be executed by the CPU 204. The main memory 206 may also be used for storing temporary variables or other intermediate information during execution of the instructions to be executed by the CPU 204. The drill string analysis system 200 may further include a read-only memory (ROM) 208 or other static storage device coupled to the bus 202 for storing static information and instructions for the CPU 204. A computer-readable storage device 210, such as a nonvolatile memory (e.g., Flash memory) drive or magnetic disk, may be coupled to the bus 202 for storing information and instructions for the CPU 204. The CPU 204 may also be coupled via the bus 202 to a display 212 for displaying information to a user. One or more input devices 214, including alphanumeric and other keyboards, mouse, trackball, cursor direction keys, and so forth, may be coupled to the bus 202 for communicating information and command selections to the CPU 204. A communications interface 216 may be provided for allowing the drill string analysis system 200 to communicate with an external system or network.

The term "computer-readable instructions" as used above refers to any instructions that may be performed by the CPU 204 and/or other components. Similarly, the term "computer-readable medium" refers to any storage medium that may be used to store the computer-readable instructions. Such a medium may take many forms, including, but not limited to, non-volatile media, volatile media, and transmission media. Non-volatile media may include, for example, optical or magnetic disks, such as the storage device 210. Volatile media may include dynamic memory, such as main memory 206. Transmission media may include coaxial cables, copper wire and fiber optics, including wires of the bus 202. Transmission itself may take the form of electromagnetic, acoustic or light waves, such as those generated during radio frequency (RF) and infrared (IR) data communications. Common forms of computer-readable media may include, for example, magnetic medium, optical medium, memory chip, and any other medium from which a computer can read.

In accordance with the disclosed embodiments, a drill string analysis application 218, or rather the computer-readable instructions therefor, may also reside on or be downloaded to the storage device 210. In general, the drill string analysis application 218 is a computer program that substantially implements the concepts and principles disclosed herein. The computer program may be executed by the CPU 204 and/or other components of the drill string analysis system 200 to generate a model or analysis of the drill string operation. Such a drill string analysis application 218 may be written in any suitable computer programming language known to those having ordinary skill in the art using any suitable software development environment known to those having ordinary skill in the art. Examples of suitable programming languages may include C, C++, C#, FORTRAN, MATLAB (from The MathWorks, Inc.), and LabVIEW (from National Instruments, Inc.), and the like.

Examples of suitable software development environments include Visual Studio from Microsoft Corporation, and the like.

Figure 3:
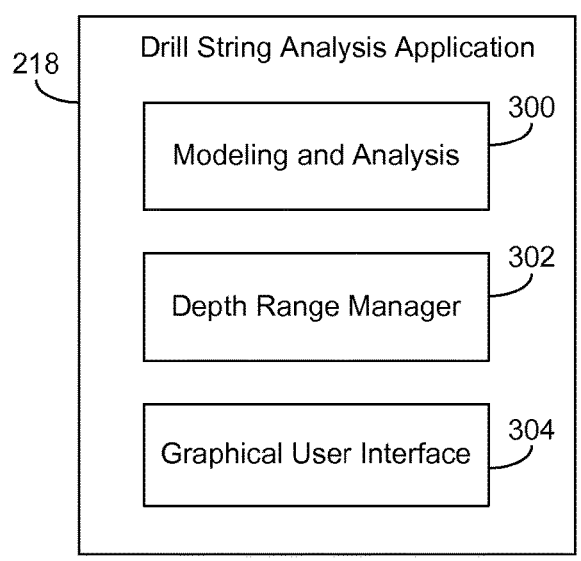
FIG. 3 is a functional diagram of an exemplary application that may be used to perform drill string analysis according to the disclosed embodiments

FIG. 3 illustrates the drill string analysis application 218 in more detail according to the disclosed embodiments. Among other things, the drill string analysis application 218 includes a modeling and analysis module 300 that is capable of providing a full range of modeling and analyses for a drill string operation. Examples of the types of analyses that may be performed by the drill string analysis application 218 include analysis of torque and drag. This type of analysis helps users to plan and analyze drilling, casing, and completion running operations, and assess the impact of predicted loads related to torque and drag. The main calculations include drill string tension, torque, side force, fatigue, and tri-axial stress. A top-down analysis allows users to know accurately the forces acting along the string all the way down to the bottom of the well based on surface parameters. The analysis also accounts for the effects of hydraulic parameters like fluid properties, flow rate, diverse fluid columns, and pressures. Temperature effects on the drill string may also be considered for the pipe stretch calculations.

The drill string analysis application 218 is also capable of providing hydraulic analysis, which may be used to model and predict pressure losses across the circulating system of the rig and the drill string, estimate the equivalent circulating density (ECD) across the annular space between the casing and the drill string, and analyze formation cuttings transport and its effect on pressure and ECD calculations. Temperature effect may also be considered using four different rheological models, fluid compressibility, Fann® Viscometer readings at different temperature points, critical fluid velocity, and bit-nozzle size calculations for optimized rate of penetration. The analysis may also consider string eccentricity effect, pipe roughness, returns to sea floor for dual-gradient operations and backpressure for underbalanced operations.

Another type of analysis provided by the drill string analysis application 218 is casing centralization placement. This type of analysis determines proper casing centralization placement, which is a key factor in completing an optimum and safe cementing job. This analysis allows users to calculate centralizer placement for any combination of borehole size, pipe size, and centralizer, as well as determine the optimum spacing between centralizers to achieve a desired casing stand-off, including the effect of torque and drag forces and survey tortuosity. The drill string analysis application 218 provides a simple and intuitive graphical interface that offers a fast and effective method to input the appropriate data and then visualize the results in an easy-to-understand way, making it simple to compare different alternatives to optimize placement along the casing string.

As part of the foregoing analyses, the drill string analysis application 218 is optimized so that users are requested to input only the parameters needed for the specific calculations to be run, a methodology sometimes referred to as "output-driving-inputs." The drill string analysis application 218 provides users with clear step-by-step guidance on what parameters are required and leads them via the intuitive graphical interface to input the appropriate parameters. The graphical interface provides dynamic navigation and visual notifications that highlight what parameters are needed and how to enter them on-the-fly so user are always sure what needs to be done next. The outputs are calculated when all the right operation parameters are provided to the drill string analysis application 218, thus enabling users to obtain more accurate results more quickly.

In addition, the drill string analysis application 218 also includes a depth range manager module 302 that allows the above analyses to be performed over multiple different depth ranges and, for a given session, is able to retain the various analyses and their associated operational parameters rather than discarding them each time a different depth range analysis is performed. This allows users more easily to select and view individual analyses, switching from one analysis to another as desired, and also compare multiple analyses to one another on a side-by-side basis, as the various analyses have been retained and are readily available. These analyses may be "fixed" depth analyses, which provide a snapshot of the drill string operation at a particular moment in time, or they may be "run" depth analyses, which provide a simulation of the drill string operation in near real time as the drill string progresses down through the formation 104.

As well, the drill string analysis application 218 includes a graphical user interface module 304 that displays data and information to users and allow the users to interact and otherwise provide input to the drill string analysis application 218. Although a graphical user interface having a particular layout is shown and described herein, such a graphical user interface layout is illustrative only and other layouts may be derived without departing from the scope of the disclosed embodiments. Following are exemplary implementations of the various modules 300-304 of the drill string analysis application 218 according to the disclosed embodiments.

Referring now to FIGS. 4 and 4A-4C, an exemplary graphical interface 400 is shown that may be used with the drill string analysis application 218 according to the disclosed embodiments. As can be seen, the graphical interface 400 is composed of several sections, including an operational parameters section 402 depicted in FIG. 4A, an analysis settings section 404 depicted in FIG. 4B, and an analysis results section 406 depicted in FIG. 4C. It should be emphasized that the particular sections and the side-by-side layout of the graphical interface 400 shown here is exemplary only, and that other arrangements may be derived by those having ordinary skill in the art without departing from the scope of the disclosed embodiments. Each of the sections 402, 404, and 406 is described below.

In general, the operational parameters section 402 is used by the drill string analysis application 218 as the main user input section. This section displays (via the display unit 212) a plurality of fields for receiving user input on the operational parameters that the drill string analysis application 218 needs from the users. Users may specify (via the input devices 214), among other things, the depth ranges over which the drill string operations are analyzed, and may also vary the values for particular operational parameters of interest. As explained above, the drill string analysis application 218 employs an output-driving-inputs methodology so that only the fields for the operational parameters required to perform a specific analysis are displayed. The specific operational parameters needed depends on the type of analysis the user selected.

The analysis settings section 404 is used by the drill string analysis application 218 to display the non-operational drill string parameters that are involved in the calculations for the selected analyses. These analysis settings may include common analysis settings, indicated generally at area 420, that are applicable to all calculations performed by the drill string analysis application 218. Examples of common analysis settings may include analysis step size, seawater density, and similar non-operational drill string parameters, and the like. The analysis settings section 404 may also display specific analysis settings, indicated generally at area 422, that are used by the drill string analysis application 218 to perform calculations for a particular analysis. For example, the analysis settings section 404 may display analysis settings specific to a torque and drag analysis, such as analytical method used, string analysis model, maximum overpull, fluid column, and the like.

As for the analysis results section 406, when the analysis calculations are complete, this section is used by the drill string analysis application 218 to display the results of the analyses it performed. These analysis results are typically displayed as one or more plots representing the stresses experienced by the drill string, including tension, torque, fatigue, side forces, and the like that were calculated as part of the analysis. In a typical display, the vertical axis represents the depth penetrated by the drill string through the formation 114 while the horizontal axis represents the stress on the drill string, with the particular type of stress depending on the specific analysis being performed (e.g., equivalent circulating density (ECD), string tension, hook load at surface, etc.).

In accordance with the disclosed embodiments, the drill string analysis application 218 includes a depth range manager 410 for allowing users to define and run multiple analyses of the drill string operation in a given modeling session. These multiple analyses are then saved and retained by the depth range manager 410 so users may recall, rerun, or otherwise revisit the analyses at any time without having to redefine the analyses. Users may also open the modeling session of interest, or rather the file representing the modeling session, at a later time to gain access to the analyses again.

Figure 4:
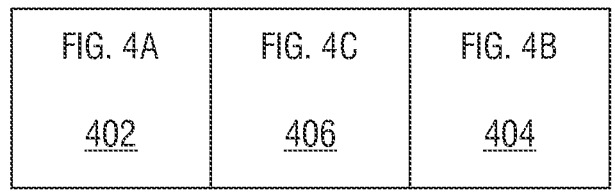
FIGS. 4 and 4A-4C is an exemplary user interface for implementing a single fixed depth analysis according to the disclosed embodiments.
Figure 4A:
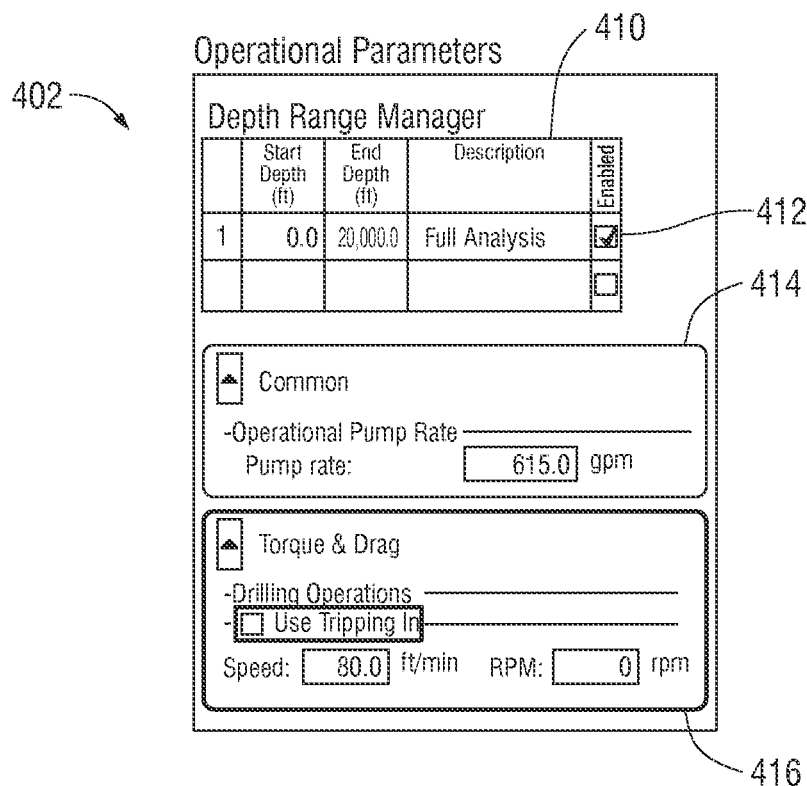

A visual implementation of the depth range manager 410 is provided in the operational parameters section 402 in the form of a table 410 in FIG. 4A. As can be seen, the depth range manager 410 contains one or more rows 412, each row 412 representing a separate analysis of the drill string operation. In the example shown, each row 412 contains a start depth field for specifying a start depth of the analysis, and an end depth field for specifying the end depth of the analysis, and a description field for generally describing the type of analysis. Users may then fill in the start depth, end depth, and description fields, either manually or through the use of drop-down menus, or both, for each of the analyses to be performed. In the simplistic example of FIG. 4A, the user has specified a fixed depth analysis starting at zero feet and ending at 20,000 feet, which represents the entire drill zone within the formation 114. An enabled field in each row of the depth range manager 410 allows the users to select which analysis to display in the analysis results section 406, as will be seen later herein.

For each row in the depth range manager 410, the drill string analysis application 218 requests users to specify a set of common operational parameters for the analysis corresponding to that row, indicated generally at area 414, and a set of analysis specific operational parameters for the analysis corresponding to that row, indicated generally at area 416. As mentioned previously, the specific operational parameters requested by the drill string analysis application 218 depend on the type of analysis the user has selected to be performed. In the simplistic example of FIG. 4A, the user has selected a torque and drag analysis, so the drill string analysis application 218 has requested the user to specify a pump rate as the common operational parameter. This operational parameter is then used by the drill string analysis application 218 for all stress calculations associated with the torque and drag analysis. In addition, the user has selected an analysis of the trip in stress to be performed in connection with the torque drag analysis, so the drill string analysis application 218 has requested the user specify the tripping in parameters, including the tripping in speed of the drill string and the revolutions per minute (RPM) of the drill string.

Note in FIG. 4A that the user has not yet filled in the operational parameters at 416 that were requested by the drill string analysis application 218. The drill string analysis application 218 detects these missing values as part of its output-driving-inputs methodology, which includes a validation function that checks whether the operational parameters required for a particular analysis have been filled in as well as whether the values specified by the user for those parameters are valid. If the drill string analysis application 218 is unable to validate the required operational parameters, it alerts or otherwise notifies the user of the problem and waits for the error to be corrected before performing the requested analysis.

Consistent with the output-driving-inputs methodology, each row of the depth range manager 410, or rather the operational parameters associated with each row, is validated by the drill string analysis application 218. In the example of FIG. 4A, the analysis associated with Row 1 is missing an operational parameter needed for the torque and drag analysis. The drill string analysis application 218 notifies the user of the missing parameter by visually highlighting the fields (e.g., rendering their borders in an attention-getting color, or flashing, or both) that have a problem and waits for the user to fill in the missing parameter. Once the missing parameter is filled in, the drill string analysis application 218 again validates the parameter to ensure it is valid.

Figure 4B:
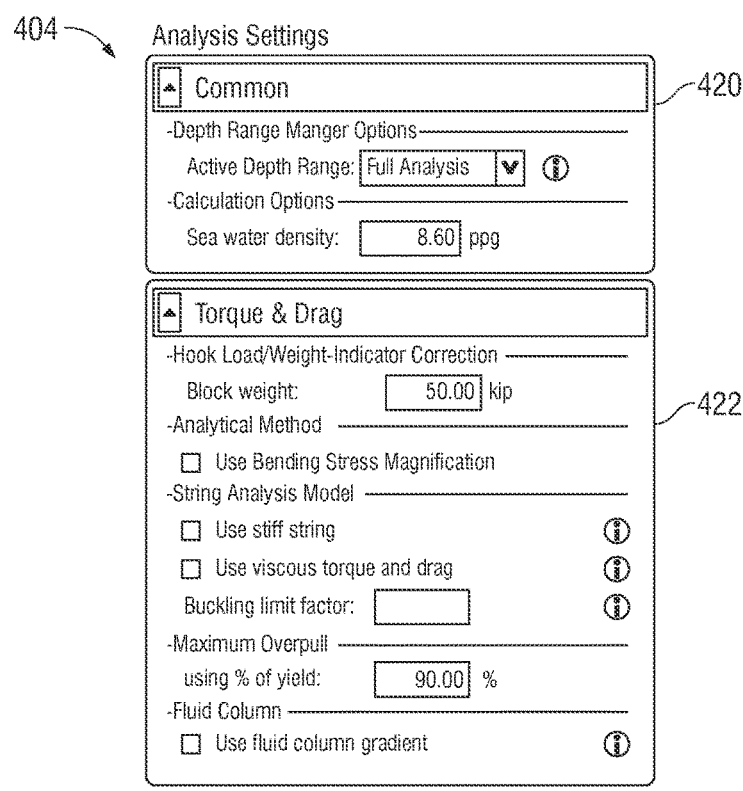
Figure 4C:
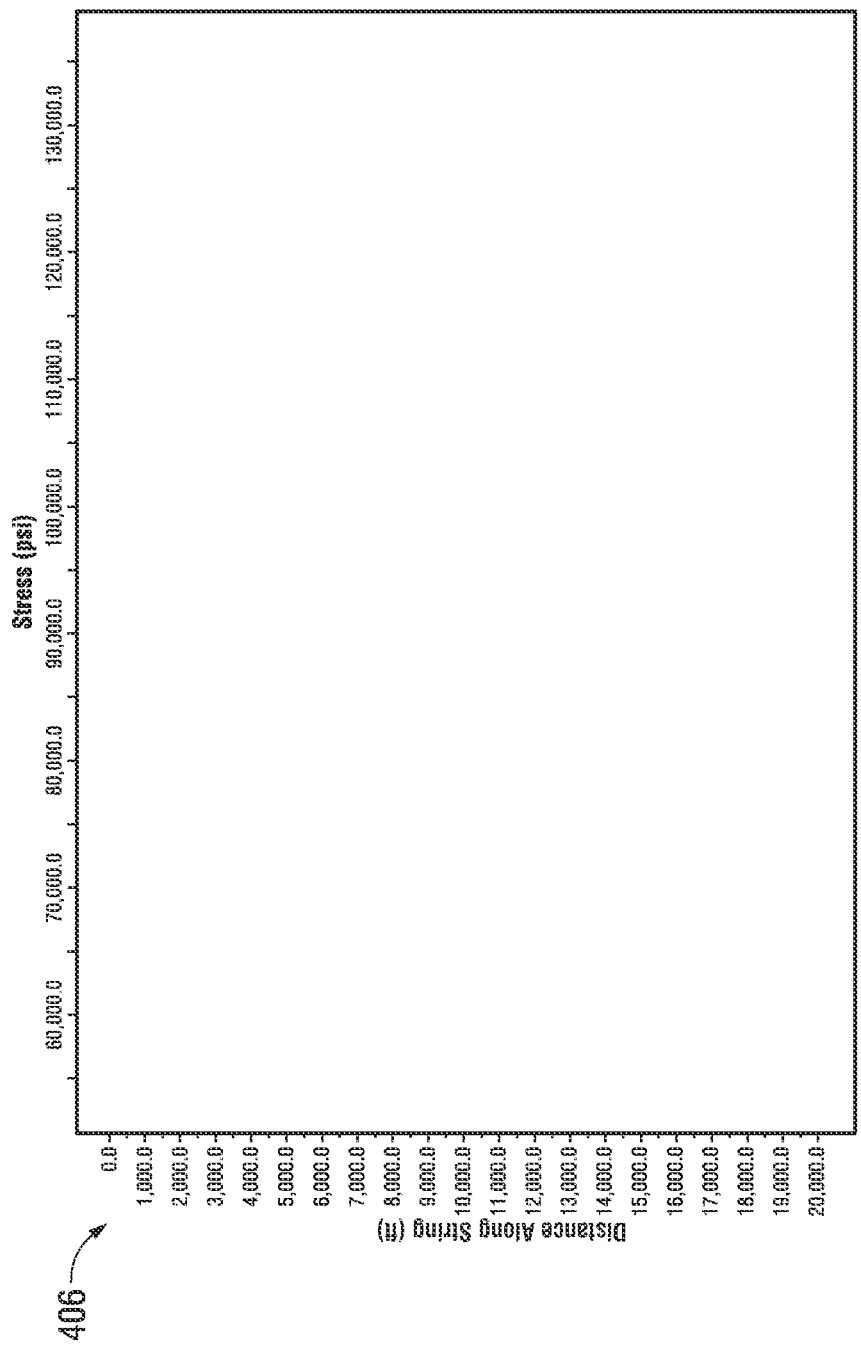
Figure 5:
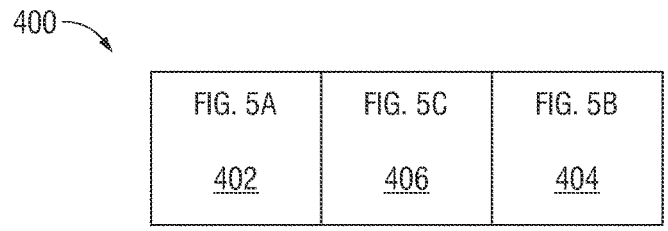
FIGS. 5 and 5A-5C illustrate additional details of the exemplary user interface in FIGS. 4 and 4A-4C according to the disclosed embodiments.
Figure 5A:
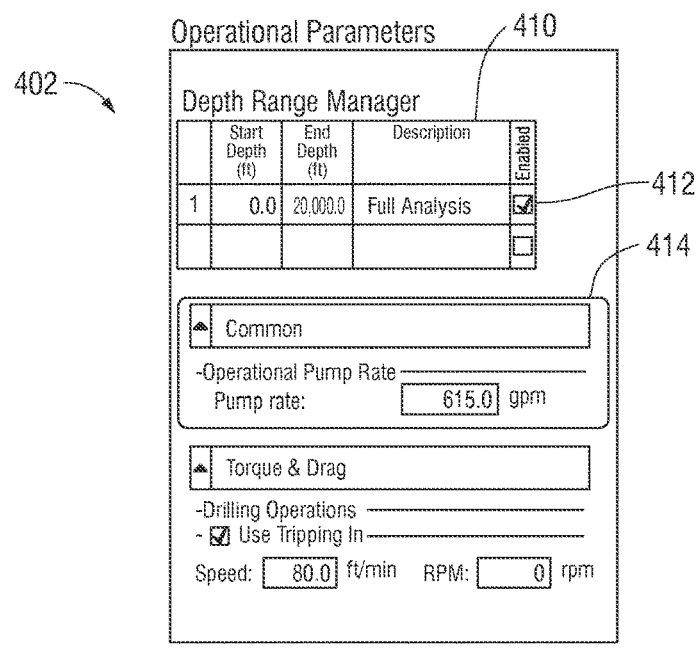
Figure 5B:
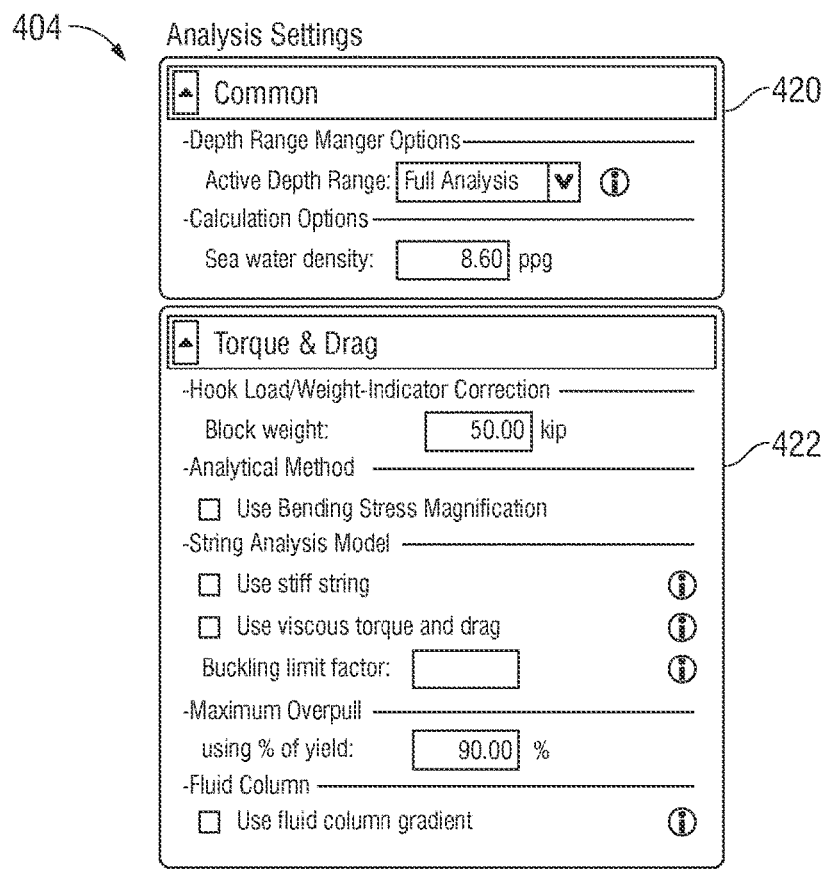
Figure 5C:
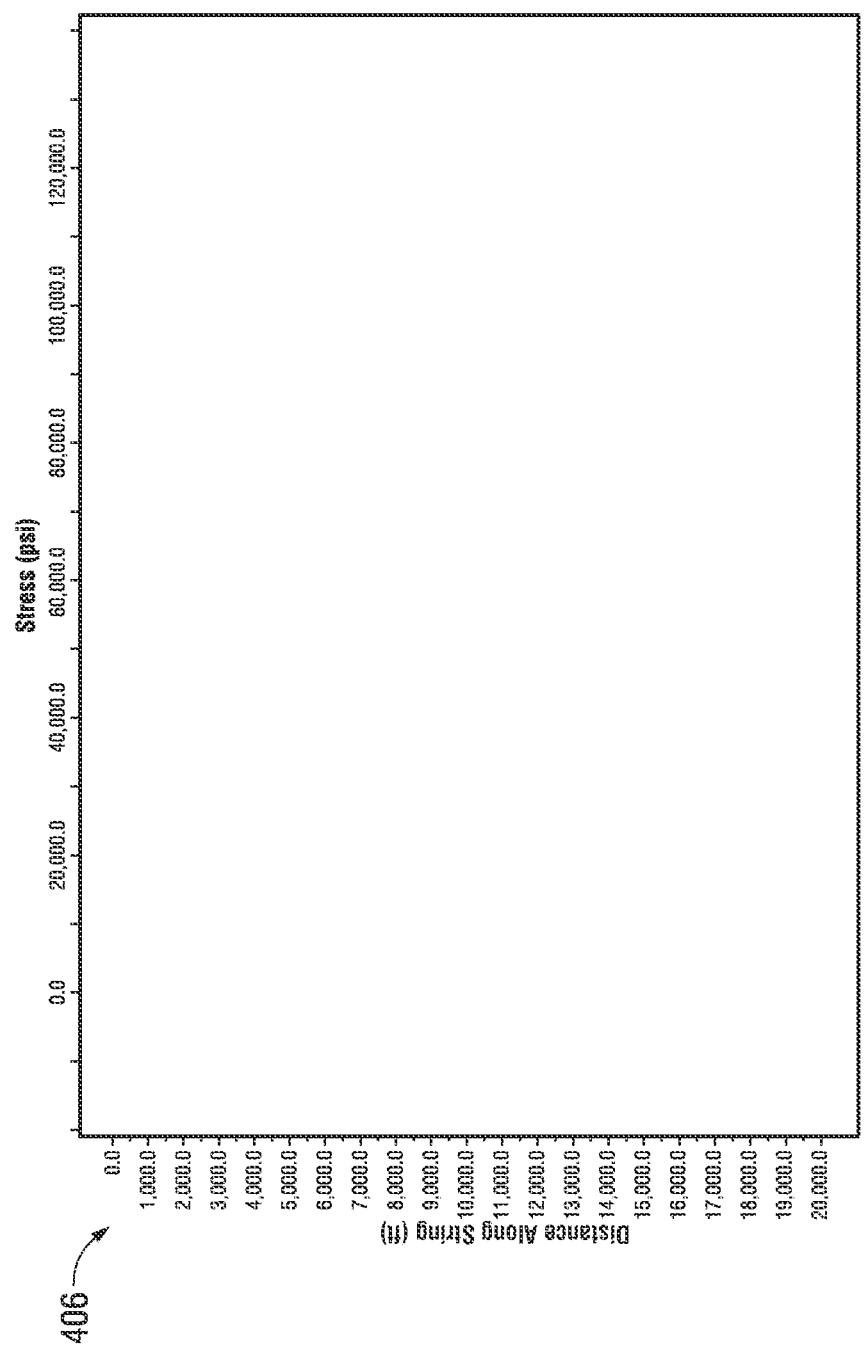
Figure 6:
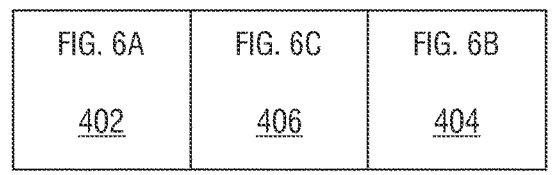
FIGS. 6 and 6A-6C illustrate still additional details of the exemplary user interface in FIGS. 4 and 4A-4C according to the disclosed embodiments.
Figure 6A:
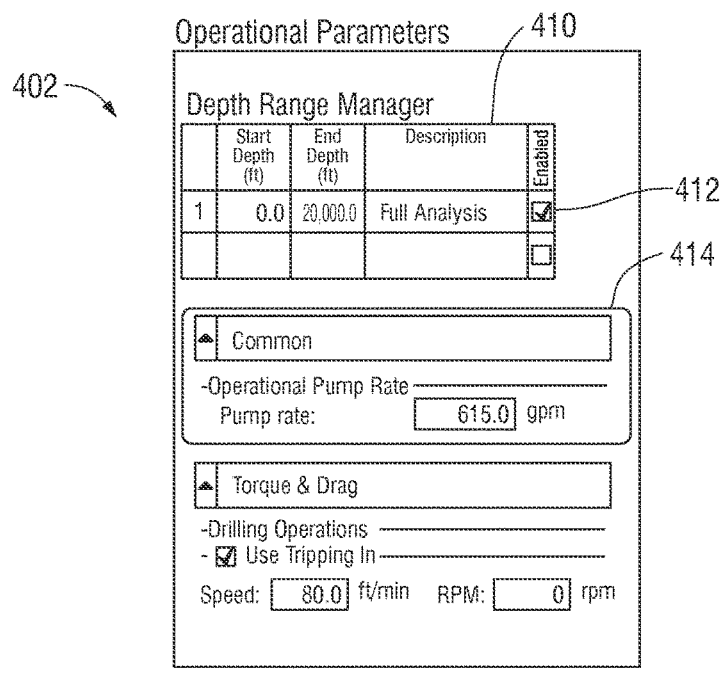
Figure 6B:
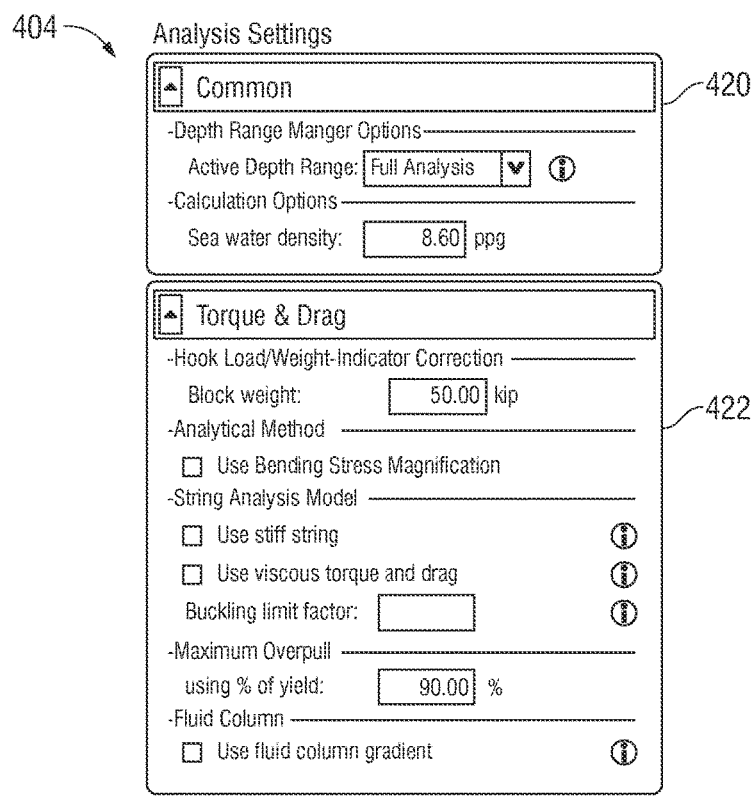
Figure 6C:
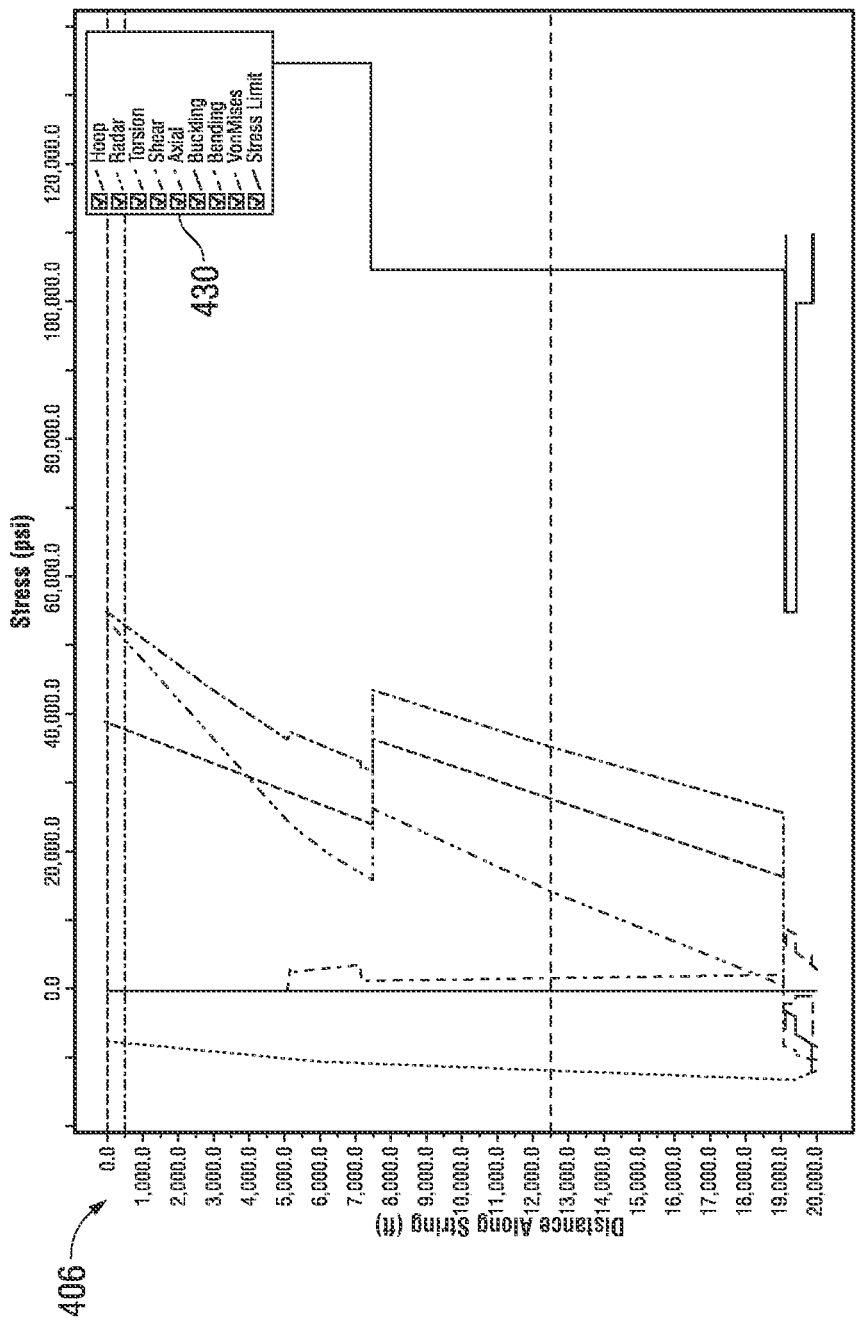
Figure 7:
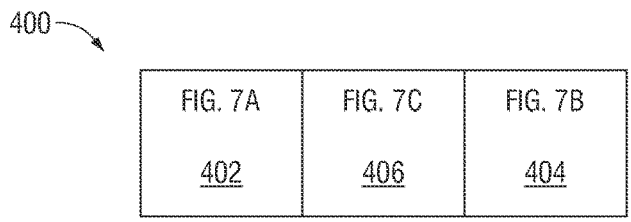
FIGS. 7 and 7A-7C illustrate the exemplary user interface in FIGS. 4A-4C being used for implementing multiple fixed depth analyses according to the disclosed embodiments.
Figure 7A:
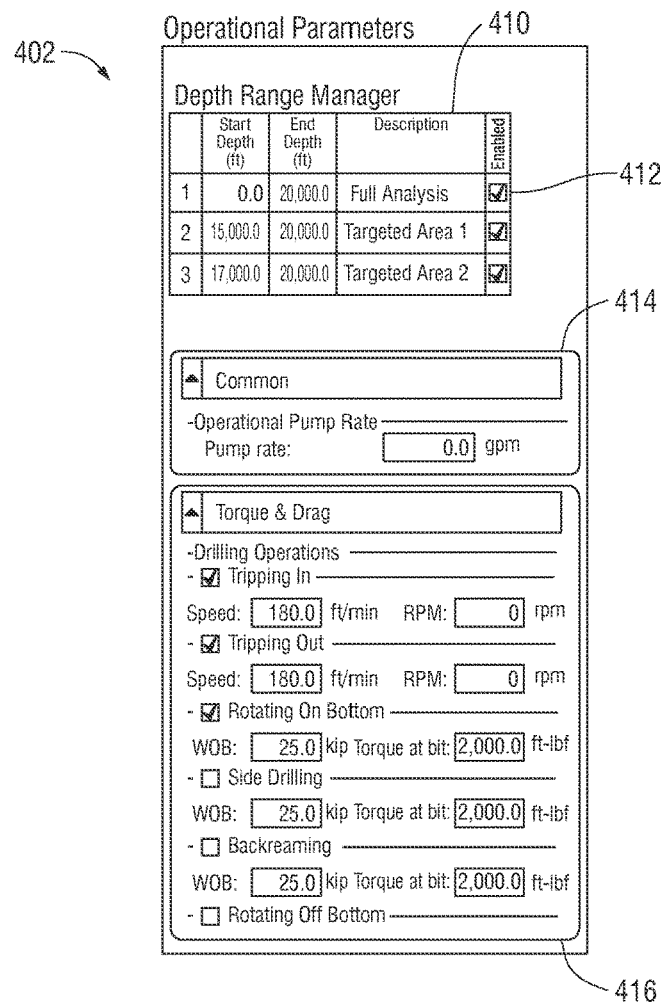
Figure 7B:
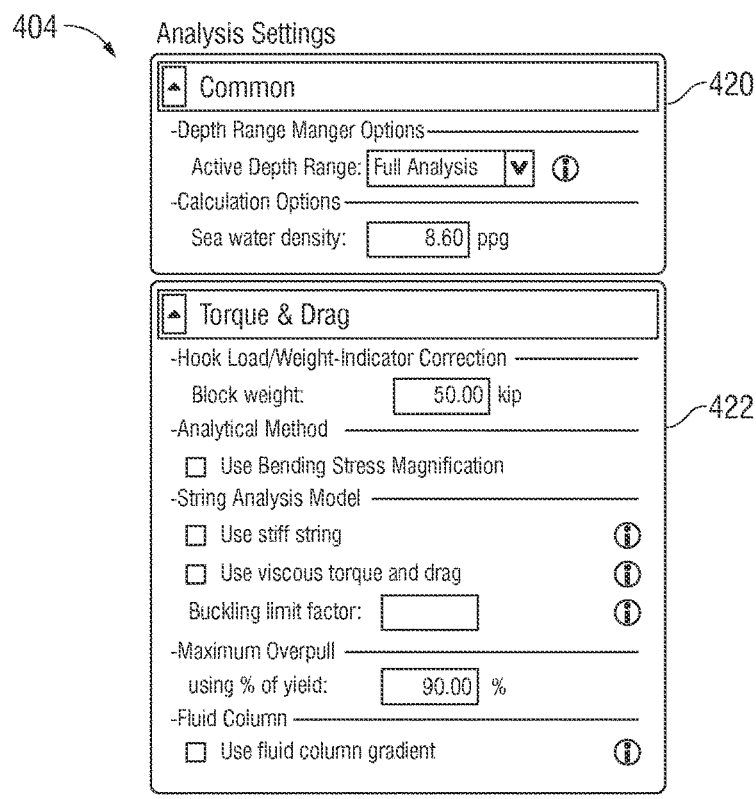
Figure 7C:
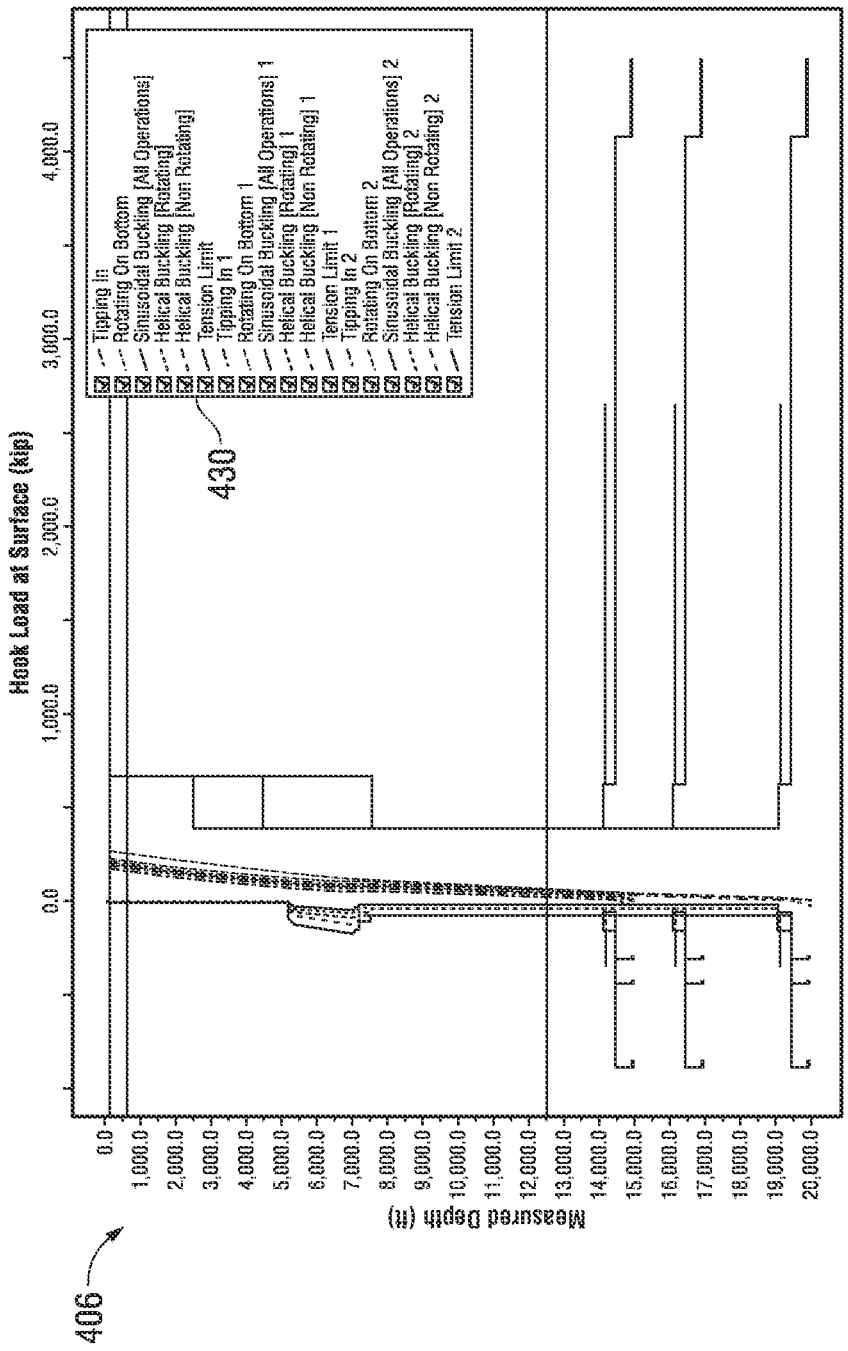
Figures 8, 8A:
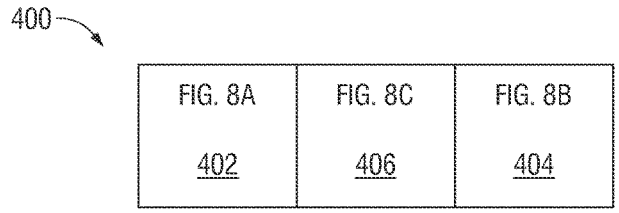
FIGS. 8 and 8A-8C illustrate an exemplary user interface for implementing multiple run depth analyses according to the disclosed embodiments.
Figure 8B:
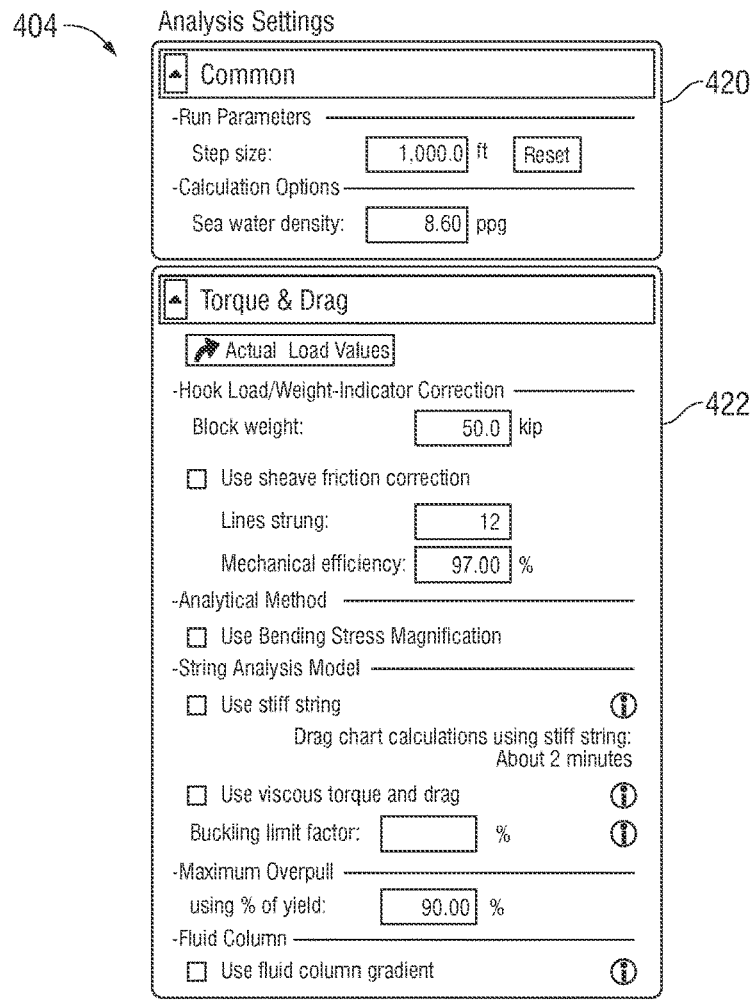
Figure 8C:
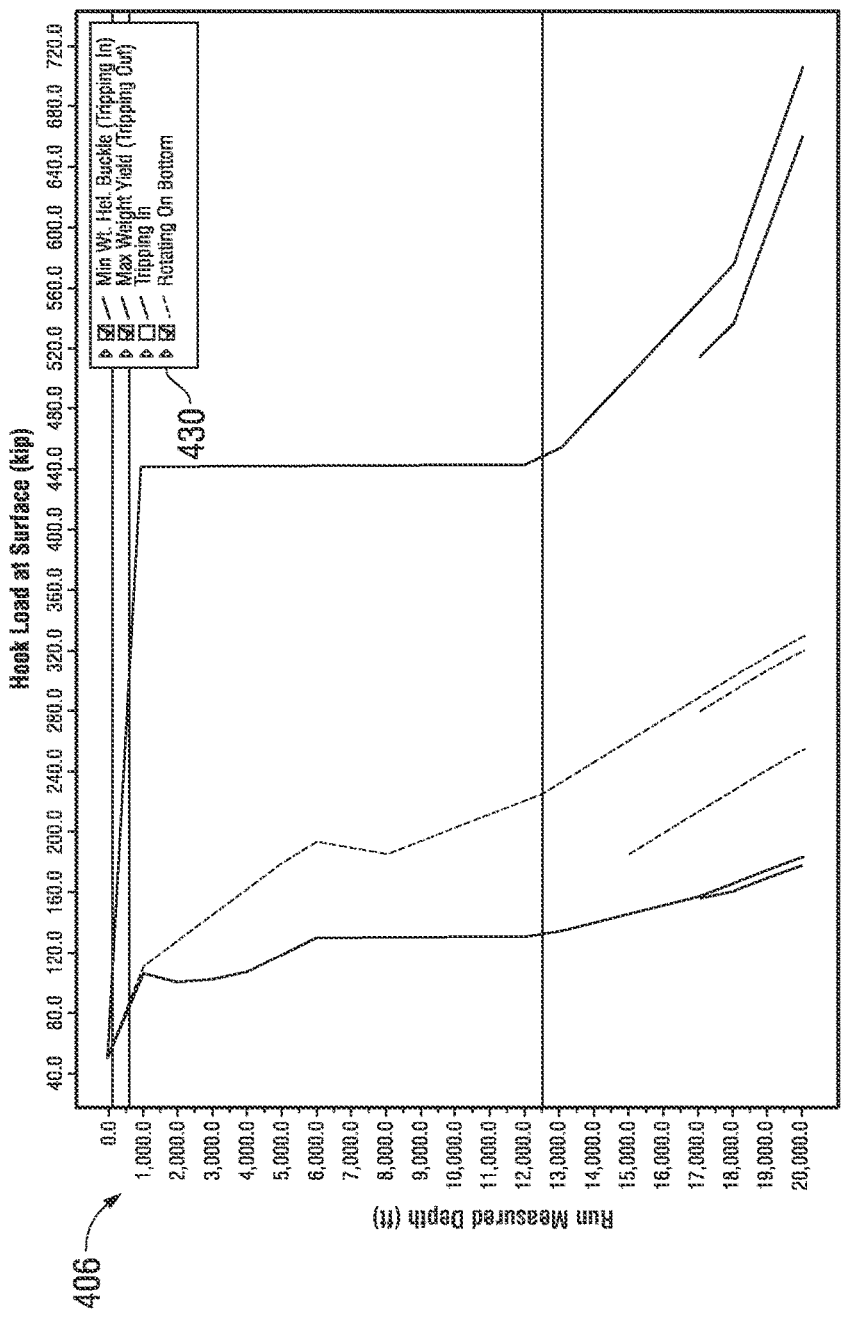
Figure 9:
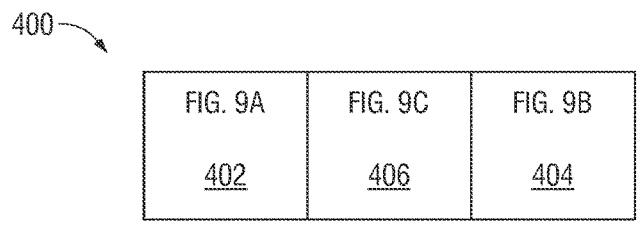
FIGS. 9 and 9A-9C illustrate additional details of the exemplary user interface in FIGS. 8 and 8A-8C according to the disclosed embodiments.
Figure 9A:
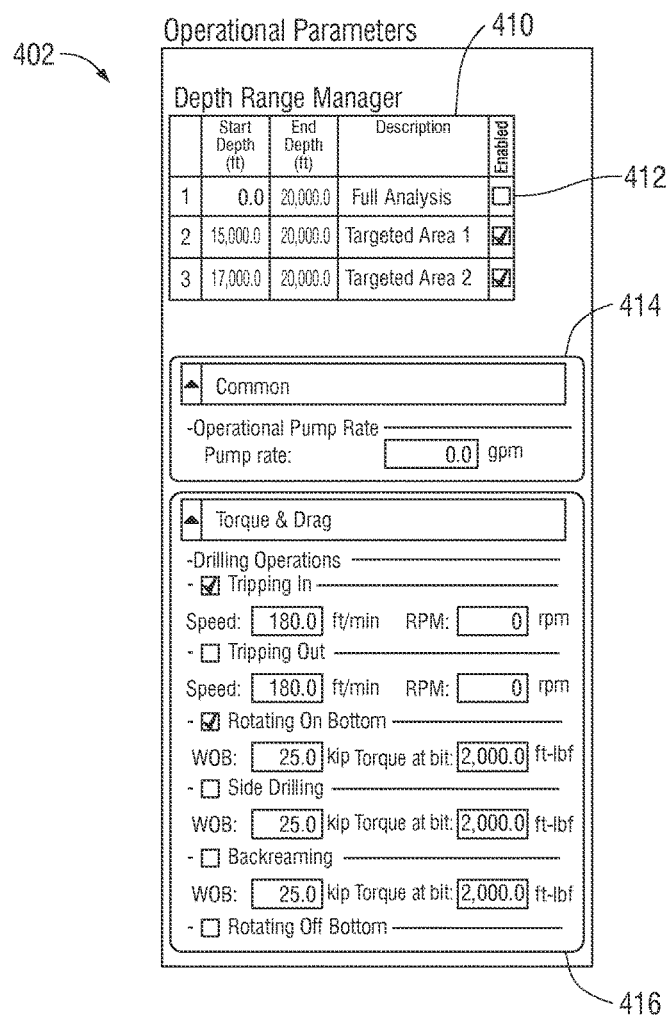
Figure 9B:
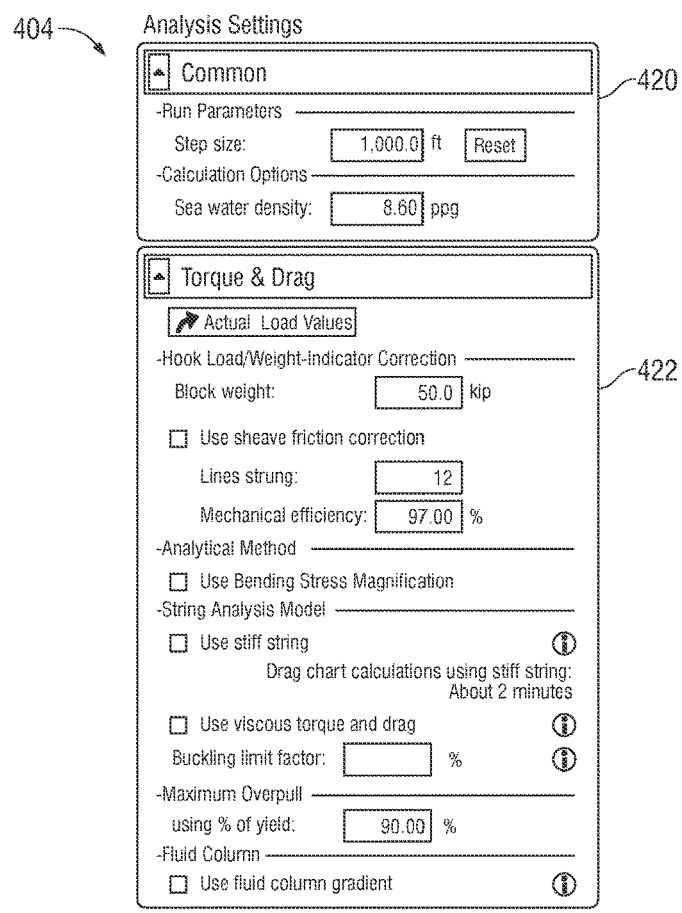
Figure 9C:
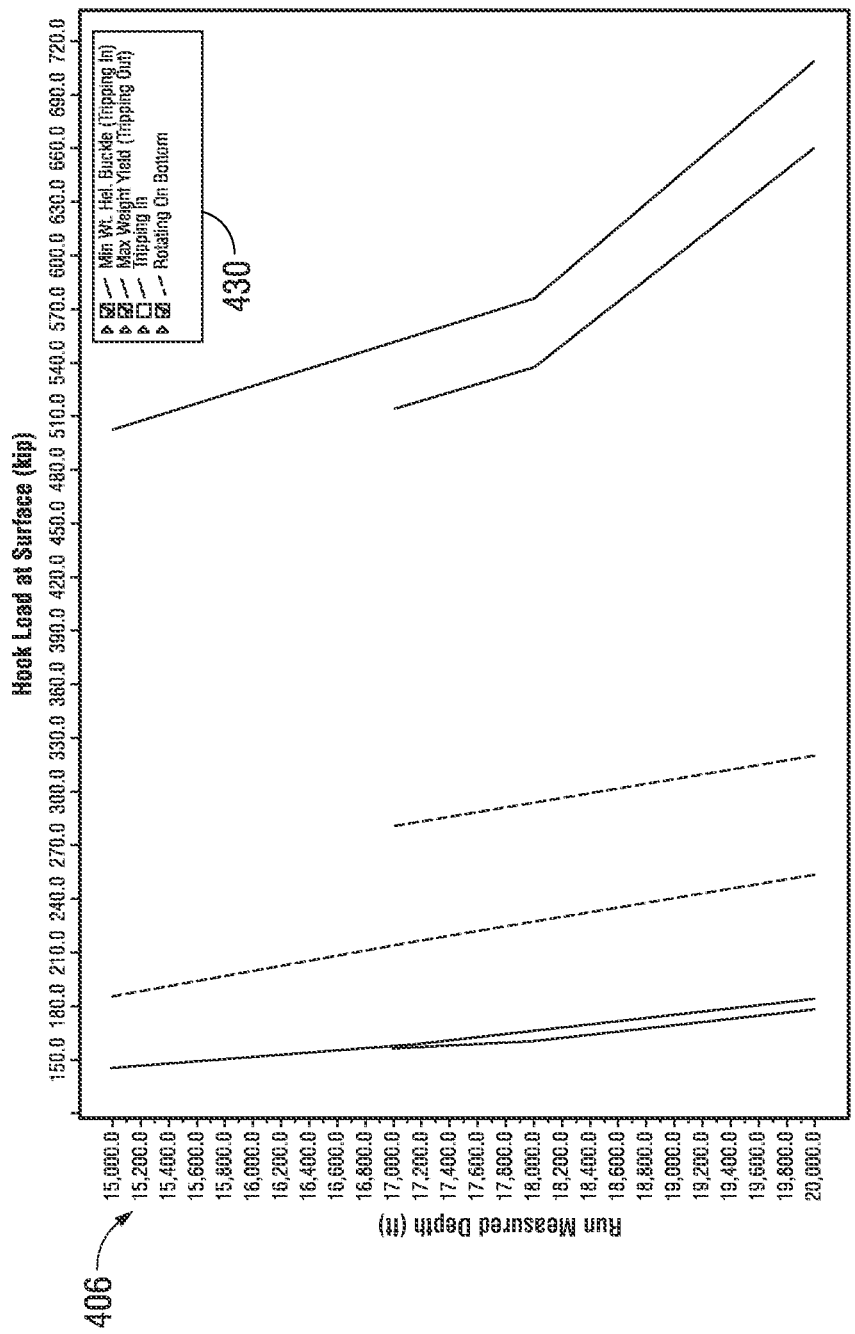

FIGS. 5 and 5A-5C illustrate the graphical interface 400 of FIGS. 4 and 4A-4C with the operational parameters required by the drill string analysis application 218 now filled in by the user for Row 1 of the depth range manager 410. As can be seen, the fields associated with Row 1 that were visually highlighted in FIGS. 4A-4C are now displayed with their normal appearance.

FIGS. 6 and 6A-6C illustrate the graphical interface 400 of FIGS. 4 and 4A-4C with the analysis results section 406 populated with a plurality of plots associated with the analysis corresponding to Row 1 of the depth range manager 410. Although not expressly depicted, these plots relate to the trip in stress and were generated by the drill string analysis application 218 using the operational parameters specified in the operational parameters section 402 and the analysis parameters shown in the analysis settings section 404.

FIGS. 7 and 7A-7C illustrate the graphical interface 400 of FIGS. 4 and 4A-4C where the depth range manager 410 now has three rows 412, Rows 1-3, each row 412 corresponding to a separate fixed depth analysis. Torque and drag is again being analyzed, as indicated by the operational parameters for the highlighted row, Row 1, displayed in the operational parameters section 402. But whereas the analysis of Row 1 extends the entire drill zone (from 0 feet to 20,000 feet), the analysis of Row 2 covers a different targeted area (from 0 feet to 15,000 feet), and the analysis of Row 4 covers yet another targeted area (from 0 feet to 17,000 feet). In addition to varying the depth ranges, although not illustrated here, the user may also vary the values in the fields of the analysis specific operational parameters areas 416 for Rows 2 and 4 so they are different from those in Row 1. This allows the user to see how changing one or more operational parameters in the targeted areas may impact the drill string operation in those areas. In some embodiments, a legend 430 may be provided in the results section 406 to help the user distinguish between the various plots.

FIGS. 8 and 8A-8C illustrate the graphical interface 400 of FIGS. 4 and 4A-4C where the depth range manager 410 once more has three rows 412, Rows 1-3, but now each row 412 corresponds to a run depth analysis instead of a fixed depth analysis. Torque and drag is once more being analyzed, as evident by the operational parameters for Row 1 in the operational parameters section 402. In this example, the analysis of Row 1 again extends the entire drill zone, but the analysis of Row 2 only covers a targeted area from 15,000 feet to 20,000 feet, and the analysis of Row 4 only covers a targeted area from 17,000 feet to 20,000 feet.

Because all three rows in the depth range manager 410 are enabled in FIGS. 8 and 8A-8C, the results for all three depth ranges are plotted in the results section 406. In this example, the user has specifically selected an analysis of the hook load tension in connection with the torque drag analysis, and therefore the plots relate to the hook load tension. If the user does not wish to see the plots for all three depth ranges, he or she may simply deselect the enabled option for the appropriate target area. This can be seen in FIGS. 9 and 9A-9C, where the user has deselected the enabled option for the first row, Row 1. As a result, only the plots for Rows 2 and 4 are now displayed in the results section 406, with the vertical axis being adjusted accordingly for the depth ranges for those target areas.

Figure 10:
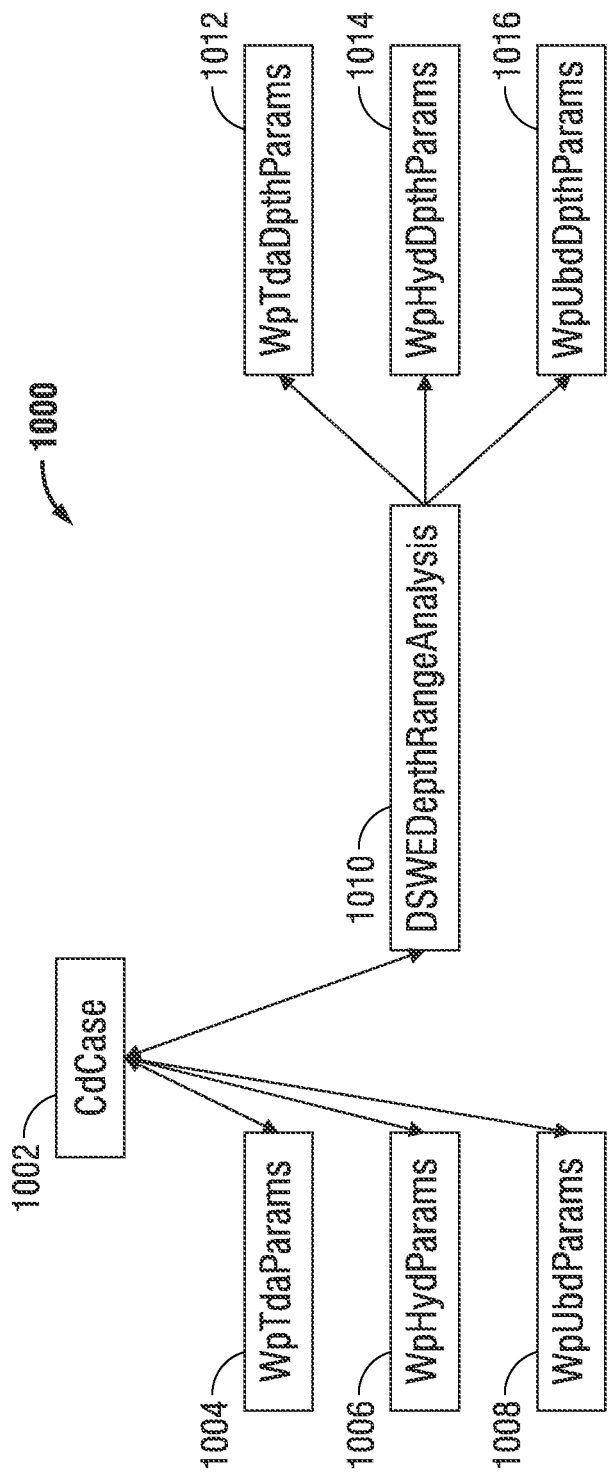
FIG. 10 is an exemplary database architecture according to the disclosed embodiments.

In order efficiently to keep track of the various depth ranges and the operational parameters associated therewith, in some embodiments, the drill string analysis application 218 uses a database architecture that specifically accommodates the depth range manager 410. FIG. 10 illustrates an exemplary database architecture 1000 that may be used by the drill string analysis application 218. Although a specific database architecture is shown, those having ordinary skill in the art understand that other database architectures may also be used without departing from the scope of the disclosed embodiments. In the embodiment of FIG. 10, for example, the database architecture 1000 is designed to be backwards compatible with legacy analyses so that existing cases, which only have a single set of operational parameters and analysis settings, are still operable with the depth range manager 410. In other embodiments, backwards compatibility may not be needed and therefore a different database architecture may be used.

In the database architecture 1000 of FIG. 10, each modeling session or case is uniquely represented by a case identifier 1002. Each case identifier 1002 has a one-to-one relationship with any legacy operational parameters and analysis settings used for that case. In the example shown here, the case identifier 1002 has a one-to-one relationship with a legacy torque and drag parameters and settings table 1004, legacy hydraulic parameters and settings table 1006, and legacy underbalanced drilling parameters and settings table 1008. These legacy parameters and settings tables are mapped to the first row of the depth range manager 410, allowing the depth range manager 410 to continue to be able to handle existing or legacy cases.

In addition to the legacy tables, the case identifier 1002 also has a one-to-one relationship with a depth range analysis table 1010 in the database architecture 1000. The depth range analysis table 1010, in turn, has a one-to-many relationship with any new operational parameters and analysis settings that are added via the depth range manager 410. In the example shown here, the depth range analysis table 1010 has a one-to-many relationship with a torque and drag parameters and settings table 1012, a hydraulic parameters and settings table 1014, and an underbalanced drilling parameters and settings table 1016. These additional parameters and settings tables are mapped to the second and subsequent rows of the depth range manager 410, allowing the depth range manager 410 to track and save any additional analyses that may be added by the user via the depth range manager 410.

FIG. 11A depicts an example of a depth range analysis table 1100 for a case in which only one depth range analysis was performed (or no additional depth range analyses were saved). As can be seen, this depth range analysis table 1100 has only one row, the fields for which are mapped to the first row of the depth range manager 410. In this example, the fields include, reading from left to right, a case identifier, wellbore identifier, well identifier, a description, a start depth, an end depth, an enabled field, and links or pointers to additional parameters and settings tables (not expressly shown). These additional tables may include a torque and drag parameters and settings table, a hydraulic parameters and settings table, and an underbalanced drilling parameters and settings table. The links or pointers are empty or contain null values in this example, except for the underbalanced drilling table, because the user has not added any additional analyses so there is only a single analysis. In some embodiments, it may be desirable to divide the legacy underbalanced drilling table 1008 so that the analysis settings remain in the legacy table while the operational parameters are stored in a new underbalanced drilling table (as indicated by the pointer or link "abcde" in FIG. 11A).

FIG. 11B depicts an example of a depth range analysis table 1102 for case in which multiple depth range of analyses were performed. Here, three additional depth range analyses were performed, as indicated by the second and subsequent rows, in addition to the depth range analysis corresponding to the first row. Thus, the links or pointers in the fields for the additional parameters and settings tables are not empty or null in this depth range analysis table 1102, but instead contain the pointers or links to the additional parameters and settings tables.

In the foregoing figures and description, a particular implementation of a depth range manager for a drill string analysis application has been disclosed. Additional and/or alternative implementations of the depth range manager may be developed without departing from the scope of the disclosed embodiments. Following now in FIG. 12 are exemplary steps or guidelines in the form of a flow chart 1200 that may be used for any implementation of a depth range manager according to the disclosed embodiments.

Figure 12:
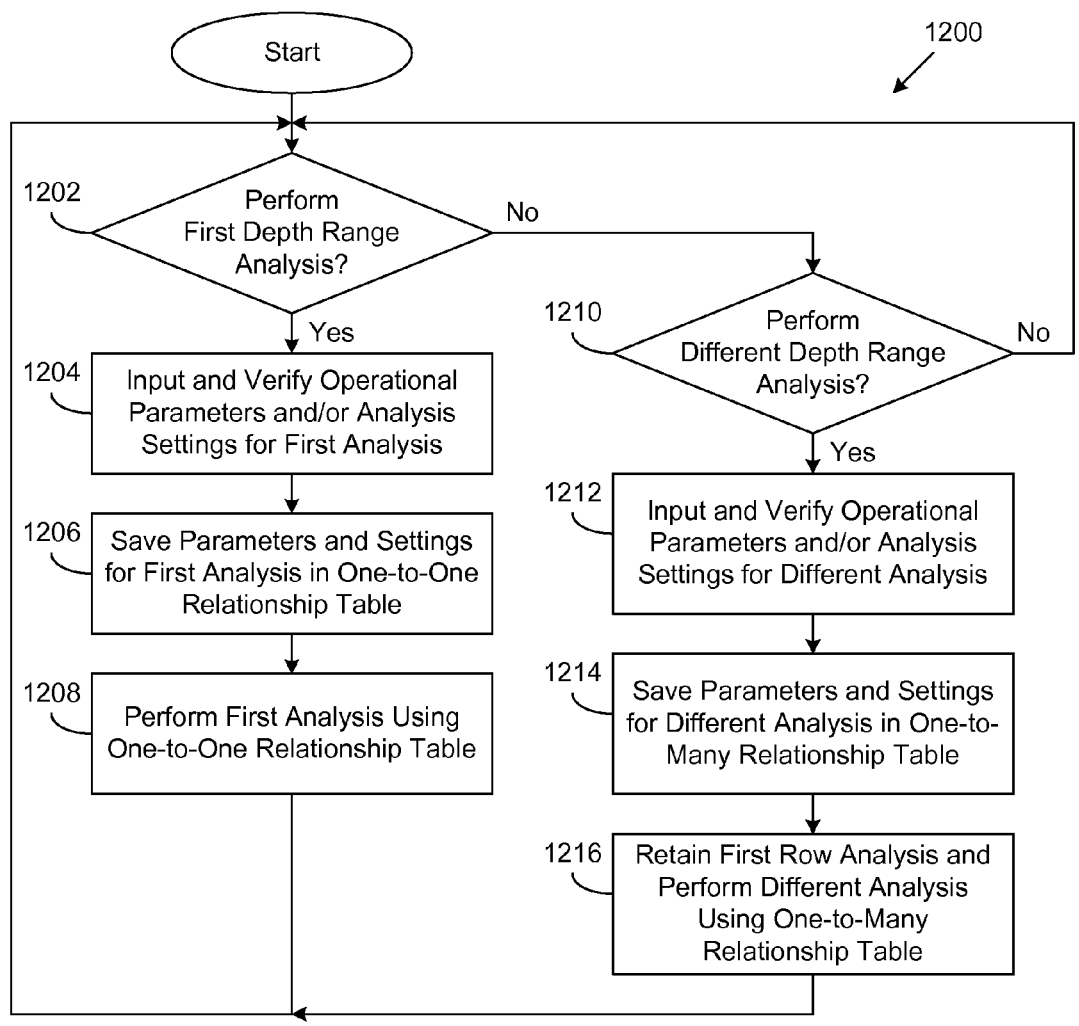
FIG. 12 is an exemplary flow chart that may be used for implementing multiple fixed depth analyses according to the disclosed embodiments.

As can be seen in FIG. 12, possible implementations of the depth range manager generally begin at step 1202, where the depth range manager makes a determination whether the user wishes to perform a first row or depth range analysis. If the determination is yes, the depth range manager inputs the operational parameters and/or analysis settings for the first row analysis at step 1204. Some of these parameters and/or settings are provided by the user through a graphical user interface, and some are predefined or default values based on the particular type of analysis selected by the user. At this time, the depth range manager may also call or otherwise use the "output-driving-inputs" functionality of the drill string analysis application discussed earlier to verify the parameters and/or settings provided by the user. The depth range manager then saves the parameters and settings for the first row analysis, or saves only the new or updated parameters and settings, in a one-to-one relationship table for later recall by the user. Thereafter, the depth range manager invokes or otherwise causes the drill string analysis application to perform a drill string analysis using the parameters and settings in the one-to-one relationship table at step 1208.

On the other hand, if the determination at step 1202 is no, the depth range manager makes a determination at step 1210 whether the user wishes to perform another or different depth range analysis from the first depth range analysis. If the determination is yes, the depth range manager inputs the operational parameters and/or analysis settings for the different depth range analysis at step 1212. As before, the depth range manager may call or otherwise use the "output-driving-inputs" functionality of the drill string analysis application to verify the parameters and/or settings provided by the user. The depth range manager then saves the parameters and settings for the different analysis, or saves only the new or updated parameters and settings, in a one-to-many relationship table for later recall by the user. Thereafter, the depth range manager invokes or otherwise causes the drill string analysis application to perform a drill string analysis using the parameters and settings in the one-to-one relationship table at step 1214. Importantly, the depth range manager retains the parameters and settings for the first depth range analysis along with the analysis results therefor in addition to those for the different analysis.

The depth range manager subsequently returns to step 1202 to check whether the user wishes to perform another first depth range analysis. In a similar manner, if the determination at step 1210 is no, the depth range manager also returns to step 1202 to check whether the user wishes to perform a first depth range analysis.

Thus, as set forth above, the embodiments disclosed herein may be implemented in a number of ways. In general, in one aspect, the disclosed embodiments relate to a computer-based analysis system for analyzing a drill string operation in a subterranean formation. The system comprises, among other things, a central processing unit mounted within the computer-based analysis system, and a display electrically connected to the central processing unit, the display displaying a graphical interface for the computer-based analysis system. The system further comprises at least one user input device electrically connected to the central processing unit, the at least one user input device receiving user inputs from a user through the graphical interface for the computer-based analysis system. A storage device electrically is connected to the central processing unit, the storage device storing a depth range manager application for the graphical interface of the computer-based analysis system. The depth range manager application provides a first set of input fields and a second set of input fields, the first set of input fields allowing the user to enter a first set of user inputs to be used by the computer-based analysis system to perform a first drill string analysis, and the second set of input fields allowing the user to enter a second set of user inputs to be used by the computer-based analysis system to perform a second drill string analysis, the first set of user inputs being different from the second set of user inputs.

In general, in another aspect, the disclosed embodiments relate to a computer-based analysis method for analyzing a drill string operation in a subterranean formation. The method comprises, among other things, receiving a plurality of first user inputs from a user via at least one user input device for subsequent use in performing a first drill string analysis, and receiving a plurality of second user inputs from the user via the at least one user input device for subsequent use in performing a second drill string analysis. The method further comprises performing the first drill string analysis according to the first plurality of user inputs, and performing the second drill string analysis according to the second plurality of user inputs. The results of the first and second analyses are displayed as plot lines on a display, wherein the plot lines for the first analysis and the plot lines for the second analysis are displayed simultaneously on the display.

In general, in yet another aspect, the disclosed embodiments relate to a computer-readable medium storing computer-readable instructions for causing a computer to analyze a drill string operation in a subterranean formation. The computer-readable instructions comprise instructions for causing the computer to receive a plurality of first user inputs from a user via at least one user input device for subsequent use in performing a first drill string analysis, and receive a plurality of second user inputs from the user via the at least one user input device for subsequent use in performing a second drill string analysis. The computer-readable instructions further comprise instructions for causing the computer to perform the first drill string analysis according to the first plurality of user inputs, and perform the second drill string analysis according to the second plurality of user inputs. The results of the first and second analyses are displayed as plot lines on a display, wherein the plot lines for the first analysis and the plot lines for the second analysis are displayed simultaneously on the display.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the spirit and scope of the disclosed embodiments as defined in the appended claims.

What is claimed is:

1. A computer-based analysis system for analyzing a drill string operation in a subterranean formation using a Graphical User Interface (GUI) that streamlines interaction with multiple analyzing models, the system comprising:
    a central processing unit mounted within the computer-based analysis system;
    a display electrically connected to the central processing unit, the display displaying the GUI for the computer-based analysis system;
    at least one user input device electrically connected to the central processing unit, the at least one user input device receiving user inputs from a user through the GUI for the computer-based analysis system; and
    a storage device electrically connected to the central processing unit, the storage device storing a depth range manager application for the GUI of the computer-based analysis system, the GUI providing a first set of input fields and a second set of input fields based on a user selected drill string analysis operation, the first set of input fields allowing the user to enter a first set of user inputs to be used by the computer-based analysis system to perform a first drill string analysis, and the second set of input fields allowing the user to enter a second set of user inputs to be used by the computer-based analysis system to perform a second drill string analysis, the first set of user inputs being different from the second set of user inputs, the first drill string analysis includes determining at least casing centralization placement and the first set of user input fields comprising operation parameters required to perform at least casing centralization placement.

2. The computer-based analysis system of claim 1, wherein the first and second drill string analyses are selected by the user from one of the following analyses: an analysis of drill string torque and drag, and analysis of drill string hydraulics, and an analysis of underbalanced drilling on the drill string operation.

3. The computer-based analysis system of claim 1, wherein the first set of user inputs includes a first depth range within the subterranean formation and the second set of user inputs includes a second depth range within the subterranean formation, the first depth range being different from the second depth range.

4. The computer-based analysis system of claim 1, wherein the first set of user inputs includes a first drilling time within the subterranean formation and the second set of user inputs includes a second drilling time within the subterranean formation, the first drilling time being different from the second drilling time.

5. The computer-based analysis system of claim 1, wherein the first set of user inputs includes a first set of operational parameters for the drill string operation and the second set of user inputs includes a second set of operational parameters for the drill string operation, the first set of operational parameters being different from the second set of operational parameters.

6. The computer-based analysis system of claim 1, wherein the GUI displays the results of the first and second drill string analyses as plot lines, the plot lines for the first drill string analysis and the plot lines for the second drill string analysis being displayed simultaneously.

7. The computer-based analysis system of claim 1, wherein the GUI displays at least one of the fields of the first set of input fields simultaneously with at least one of the fields of the second set of input fields.

8. A computer-based analysis method for analyzing a drill string operation in a subterranean formation using a Graphical User Interface (GUI) that streamlines interaction with multiple analyzing models, comprising:
receiving, by the GUI, from a user via at least one user input device a selection of a first drill string analysis and a second drill string analysis, the first drill string analysis comprising determination of at least casing centralization placement;
displaying, by the GUI via the at least one user input device, based on user's selection, a first set of input fields and a second set of input fields, the first set of user input fields comprising operation parameters required to perform at least the casing centralization placement;
receiving, by the GUI, a plurality of first user inputs from the user using the first set of user input fields via the at least one user input device for subsequent use in performing a first drill string analysis, the first set of user input fields comprising operation parameters required to perform at least the casing centralization placement;
receiving, by the GUI, a plurality of second user inputs from the user using the second set of user input fields via the at least one user input device for subsequent use in performing a second drill string analysis;
performing the first drill string analysis according to the first plurality of user inputs, the first drill string analysis comprising at least a step of determining of casing centralization placement;
performing the second drill string analysis according to the second plurality of user inputs; and
displaying, by the GUI, the results of the first and second analyses as plot lines on a display, wherein the plot lines for the first analysis and the plot lines for the second analysis are displayed simultaneously on the display.

9. The computer-based analysis method of claim 8, further comprising storing the first and second pluralities of user inputs together as a single case on the storage device and allowing the user subsequently to retrieve both pluralities of user inputs together as a single case from the storage device.

10. The computer-based analysis method of claim 9, further comprising establishing a one-to-one relationship between the first plurality of user inputs and the single case.

11. The computer-based analysis method of claim 9, further comprising establishing a one-to-many relationship between the second plurality of user inputs and an intermediate data structure and establishing a one-to-one relationship between the intermediate data structure and the single case.

12. The computer-based analysis method of claim 11, wherein the first plurality of user inputs comprises operational parameters and analysis settings, further comprising establishing a one-to-one relationship between the analysis settings and the single case and establishing a one-to-many relationship between the operational parameters and the intermediate data structure.

13. The computer-based analysis method of claim 8, further comprising removing, by the GUI, the results of the first or second analysis upon selection by the user.

14. The computer-based analysis method of claim 8, wherein the first and second drill string analyses are selected by the user from one of the following analyses: an analysis of drill string torque and drag, and analysis of drill string hydraulics, and an analysis of underbalanced drilling on the drill string operation.

15. A non-transitory computer-readable medium storing computer-readable instructions for causing a computer to analyze a drill string operation in a subterranean formation using a Graphical User Interface (GUI) that streamlines interaction with multiple analyzing models, the computer-readable instructions comprising instructions for causing the computer to:
receive, by the GUI, from a user via at least one user input device a selection of a first drill string analysis and a second drill string analysis, the first drill string analysis comprising determination of at least casing centralization placement;
display, by the GUI via the at least one user input device, based on user's selection, a first set of input fields and a second set of input fields, the first set of user input fields comprising operation parameters required to perform at least the casing centralization placement;
receive, by the GUI, a plurality of first user inputs using the first set of user input fields from the user via the at least one user input device for subsequent use in performing a first drill string analysis, the first set of user input fields comprising operation parameters required to perform at least the casing centralization placement;
receive, by the GUI, a plurality of second user inputs from the user using the second set of user input fields via the at least one user input device for subsequent use in performing a second drill string analysis;

perform the first drill string analysis according to the first plurality of user inputs, the first drill string analysis comprising at least a step of determining of casing centralization placement;

perform the second drill string analysis according to the second plurality of user inputs; and display, by the GUI, the results of the first and second analyses as plot lines on a display, wherein the plot lines for the first analysis and the plot lines for the second analysis are displayed simultaneously on the display.

16. The computer-readable medium of claim 15, wherein the computer-readable instructions further cause the computer to store the first and second pluralities of user inputs together as a single case on the storage device and allowing the user subsequently to retrieve both pluralities of user inputs together as a single case from the storage device.

17. The computer-readable medium of claim 16, wherein the computer-readable instructions further cause the computer to establish a one-to-one relationship between the first plurality of user inputs and the single case.

18. The computer-readable medium of claim 16, wherein the computer-readable instructions further cause the computer to establish a one-to-many relationship between the second plurality of user inputs and an intermediate data structure and establishing a one-to-one relationship between the intermediate data structure and the single case.

19. The computer-readable medium of claim 18, wherein the first plurality of user inputs comprises operational parameters and analysis settings, the computer-readable instructions further causing the computer to establish a one-to-one relationship between the analysis settings and the single case and establishing a one-to-many relationship between the operational parameters and the intermediate data structure.

20. The computer-readable medium of claim 15, wherein the first and second drill string analyses are selected by the user from one of the following analyses: an analysis of drill string torque and drag, and analysis of drill string hydraulics, and an analysis of underbalanced drilling on the drill string operation.

* * * * *